(12) United States Patent
Hattori

(10) Patent No.: US 10,820,432 B2
(45) Date of Patent: Oct. 27, 2020

(54) BOARD UNIT WITH A TOOL-INSERTION RECESSED PORTION TO RELEASE ENGAGEMENT BETWEEN THE CASE AND THE COVER

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

(72) Inventor: Yuuichi Hattori, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 0 days.

(21) Appl. No.: 16/307,014

(22) PCT Filed: Jun. 6, 2017

(86) PCT No.: PCT/JP2017/021003
§ 371 (c)(1),
(2) Date: Dec. 4, 2018

(87) PCT Pub. No.: WO2017/213145
PCT Pub. Date: Dec. 14, 2017

(65) Prior Publication Data
US 2019/0223306 A1   Jul. 18, 2019

(30) Foreign Application Priority Data
Jun. 9, 2016 (JP) ................................ 2016-115542

(51) Int. Cl.
*H05K 5/02* (2006.01)
*H05K 5/03* (2006.01)
(Continued)

(52) U.S. Cl.
CPC ......... *H05K 5/0221* (2013.01); *H05K 5/0052* (2013.01); *H05K 5/0069* (2013.01);
(Continued)

(58) Field of Classification Search
CPC .. H05K 5/0221; H05K 5/0052; H05K 5/0069; H05K 5/0247; H05K 5/03; H01R 12/515; H01R 13/5213; Y10S 439/949
(Continued)

(56) References Cited

U.S. PATENT DOCUMENTS

| 6,923,660 | B2 * | 8/2005 | Takeuchi | ............. | H01R 13/506 |
| | | | | | 439/76.2 |
| 9,578,774 | B2 * | 2/2017 | Nakashima | ............ | H05K 7/026 |

(Continued)

FOREIGN PATENT DOCUMENTS

| JP | H09-045388 A | 2/1997 |
| JP | H10-051931 A | 2/1998 |

(Continued)

OTHER PUBLICATIONS

International Search Report, Application No. PCT/JP2017/021003, dated Sep. 12, 2017.

*Primary Examiner* — Travis S Chambers
(74) *Attorney, Agent, or Firm* — Honigman LLP

(57) ABSTRACT

A board unit includes a circuit board, a case for accommodating the circuit board and a bus bar electrically connected to the circuit board. A power supply terminal connects a lead-out portion of the bus bar and a connection terminal of an electrical wire. A cover covers the power supply terminal, and has a side wall overlapping the outer side of a side surface of a peripheral wall portion of the case. A stepped surface against which a lower end surface of the side wall of the cover abuts is formed in the side surface of the peripheral wall portion of the case. An engagement protruding portion (Continued)

is provided in the peripheral wall portion and the side wall of the cover. An engagement recessed portion engages the engagement protruding portion. A tool-insertion recessed portion releases the engagement protruding portion from the engagement recessed portion.

11 Claims, 4 Drawing Sheets

(51) Int. Cl.
*H05K 5/00* (2006.01)
*H01R 12/51* (2011.01)

(52) U.S. Cl.
CPC ............ *H05K 5/0247* (2013.01); *H05K 5/03* (2013.01); *H01R 12/515* (2013.01)

(58) Field of Classification Search
USPC .............................. 439/76.1, 76.2, 724, 949
See application file for complete search history.

(56) References Cited

U.S. PATENT DOCUMENTS

| | | | |
|---|---|---|---|
| 10,391,955 B2* | 8/2019 | Yamashita | ........... B60R 16/0238 |
| 2017/0290139 A1* | 10/2017 | Ooi | ...................... H05K 1/0203 |
| 2017/0305370 A1 | 10/2017 | Yamashita | |

FOREIGN PATENT DOCUMENTS

| | | | |
|---|---|---|---|
| JP | 2003-166513 A | 6/2003 |
| JP | 2005151613 A | 6/2005 |
| JP | 2006275084 A | 10/2006 |
| JP | 2009-278799 A | 11/2009 |
| JP | 2011-244647 A | 12/2011 |

* cited by examiner

BOARD UNIT WITH A TOOL-INSERTION RECESSED PORTION TO RELEASE ENGAGEMENT BETWEEN THE CASE AND THE COVER

CROSS-REFERENCE TO RELATED APPLICATIONS

This application is the U.S. national stage of PCT/JP2017/021003 filed Jun. 6, 2017, which claims priority of Japanese Patent Application No. JP 2016-115542 filed Jun. 9, 2016.

TECHNICAL FIELD

The present disclosure relates to a board unit.

BACKGROUND

In a board unit for vehicles, for example, an engagement structure (locking structure) for assembling a cover to a case utilizes engagement projections that are provided on side surfaces of the case, and engagement holes that are provided in side walls of the cover and engaged with the engagement projections, the side walls of the cover being arranged to overlap the side surfaces of the case (see JP 2005-151613A and JP 2006-275084A). Engagement between the engagement projections on the case and the engagement holes in the cover ensures the engagement between the case and the cover in an assembled state.

Also, for, example, JP 2011-244647A discloses a locking structure 3 that has a main body side engagement portion 15 in which engagement projections 18 project from left and right peripheral walls 12 of a main body 5 and lid member side engagement portions 17 that have engagement frames 21 that are provided in left and right peripheral walls 19 of a lid member 7 and engage with the engagement projections 18 (see FIGS. 1 and 2 in JP 2011-244647A). In the locking structure disclosed in JP 2011-244647A, the tip of a tool 31 is inserted between an engagement frame 21 and a peripheral wall 12 of the main body 5 in a locking state in which the engagement projections 18 engage with the engagement frames 21. Then, the engagement state between the engagement projection 18 and the engagement frame 21 can be released by lifting the engagement frame 21 from the main body 5. In JP 2011-244647A, it is described that the locking state can be easily released by using a tool.

In a board unit, a cover is detached as necessary, and thus the cover is required to be detachable from a case. Accordingly, it is desired that the engagement between the case and the cover can be easily released.

However, for example, like the locking structure described in JP 2006-275084A, if a stepped surface 23A is formed in a frame 21 of a case 20 and the lower end surface of a side wall portion 32 of a cover 30 is provided so as to abut against the stepped surface 23A, the lower end surface of the side wall portion 32 abuts against the stepped surface 23A over its entire length (see FIGS. 4 and 5 in JP 2006-275084A). In this case, the tip of a tool (e.g., a flathead screwdriver) cannot be inserted between the frame 21 of the case 20 and the side wall portion 32 of the cover 30, and also it is difficult to insert the tip of the tool into the boundary between the stepped surface 23A and the lower end surface of the side wall portion 32. Therefore, with the locking structure disclosed in JP 2006-275084A, it is difficult to release the engagement of a case and a cover by using a tool.

Accordingly, one of the objects of the present disclosure is to provide a board unit in which the engagement between a case and a cover can be easily released.

SUMMARY

A board unit according to the present disclosure includes a circuit board and a case having a peripheral wall portion for accommodating the circuit board. A bus bar is electrically connected to the circuit board and has a lead-out portion that is led out to the outside of the case. A power supply terminal connects the lead-out portion of the bus bar and a connection terminal of an electrical wire and a cover is assembled from above with respect to the case so as to cover the power supply terminal. The cover has a side wall overlapping the outer side of a side surface of the peripheral wall portion, wherein a stepped surface against which a lower end surface of the side wall of the cover abuts is formed in the side surface of the peripheral wall portion of the case. An engagement protruding portion is provided in one of the side surface of the peripheral wall portion of the case and the side wall of the cover and protrudes toward the other of the side surface of the peripheral wall portion of the case and the side wall of the cover, and an engagement recessed portion with which the engagement protruding portion is engaged is provided in the other of the side surface of the peripheral wall portion of the case and the side wall of the cover, and a tool-insertion recessed portion, into which a tool for releasing an engagement state of the engagement protruding portion and the engagement recessed portion is inserted, is provided in a boundary between the stepped surface of the peripheral wall portion of the case and the lower end surface of the side wall of the cover.

DETAILED DESCRIPTION OF PREFERRED EMBODIMENTS

Effects of this Disclosure

Figure 1:
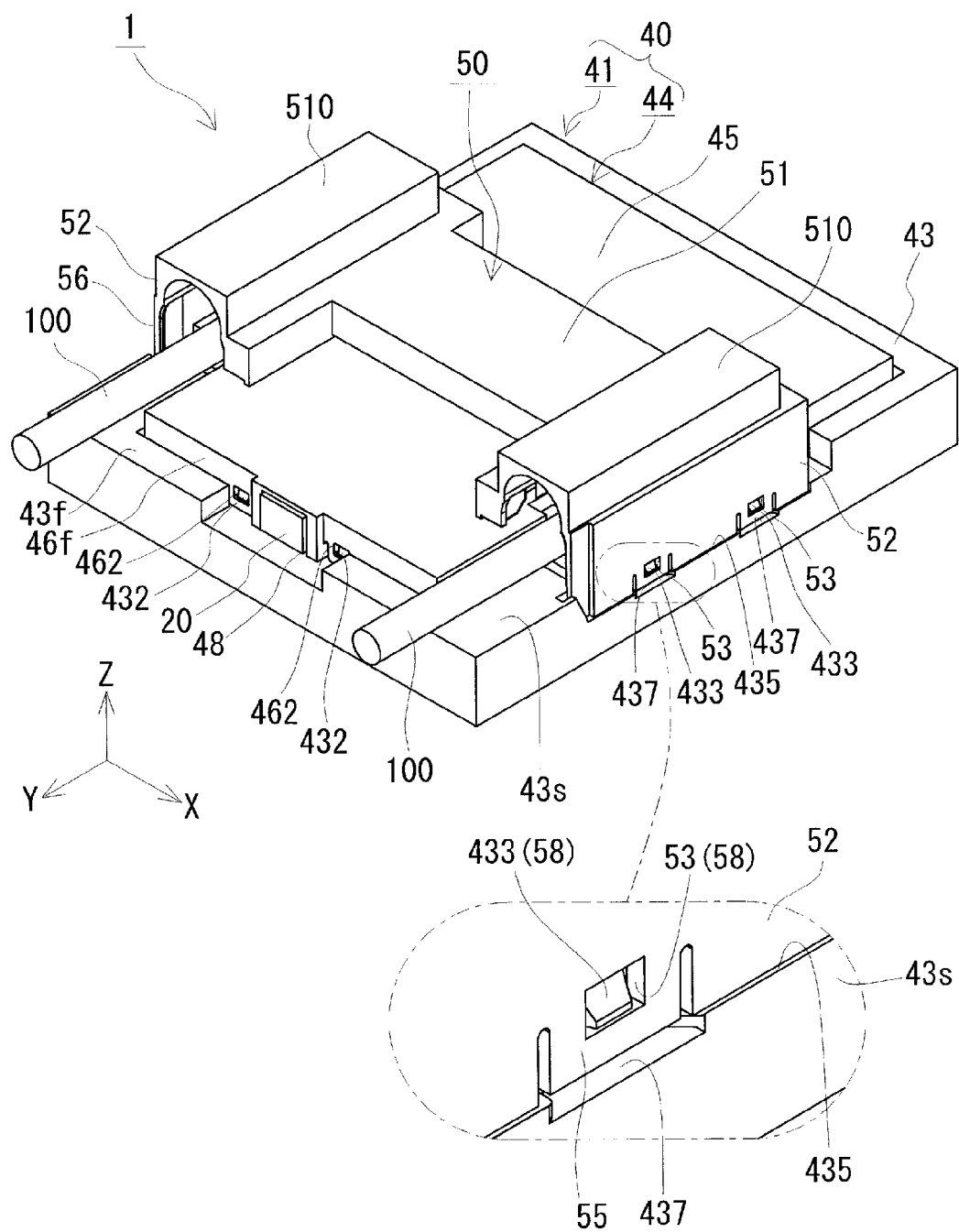
FIG. 1 is a schematic perspective view showing a board unit according to Embodiment 1.

In a board unit of the present disclosure, the engagement between a case and a cover can be easily released.

First, aspects of the present disclosure are described one by one.

A board unit according to one aspect of the present disclosure includes a circuit board and a case having a peripheral wall portion for accommodating the circuit board. A bus bar is electrically connected to the circuit board and has a lead-out portion that is led out to the outside of the case. A power supply terminal connects the lead-out portion of the bus bar and a connection terminal of an electrical wire. A cover that is assembled from above with respect to the case so as to cover the power supply terminal has a side wall overlapping the outer side of a side surface of the peripheral wall portion, wherein a stepped surface against which a lower end surface of the side wall of the cover abuts is formed in the side surface of the peripheral wall portion of the case. An engagement protruding portion is provided in one of the side surface of the peripheral wall portion of the case and the side wall of the cover and protrudes toward the other of the side surface of the peripheral wall portion of the case and the side wall of the cover, and an engagement recessed portion with which the engagement protruding portion is engaged is provided in the other of the side surface of the peripheral wall portion of the case and the side wall of the cover, and a tool-insertion recessed portion, into which a tool for releasing an engagement state of the engagement protruding portion and the engagement recessed portion is inserted, is provided in a boundary between the stepped surface of the peripheral wall portion of the case and the lower end surface of the side wall of the cover.

According to the above board unit, the engagement protruding portion provided in one of the side surface of the peripheral wall portion of the case and the side wall of the cover is engaged with the engagement recessed portion provided in the other of the side surface of the peripheral wall portion of the case and the side wall of the cover. Furthermore, the tool-insertion recessed portion is provided in the boundary between the stepped surface of the peripheral wall portion of the case and the lower end surface of the side wall of the cover. Accordingly, the engagement state between the engagement protruding portion and the engagement recessed portion can be released with a tool, by inserting the tool into the tool-insertion recessed portion and deforming the side wall of the cover in the direction away from the side surface of the peripheral wall portion of the case. Therefore, in the above board unit, the engagement between the case and the cover can be easily released by using a tool, and the cover can be easily detached from the case.

Also, because the stepped surface against which the lower end surface of the side wall of the cover abuts is formed on the side surface of the peripheral wall portion of the case, the side surface of the peripheral wall portion and the outer surface of the side wall can be substantially flush with one another in the state where the case and the cover are engaged. For this reason, the side wall of the cover does not protrude past the side surface of the peripheral wall portion of the case, the size of the board unit can be reduced while maximally securing, in the case, the accommodation space for accommodating the circuit board. Accordingly, the above board unit can be arranged in the limited installation space of a vehicle, and thus the installation space can be used to its fullest.

In one embodiment of the above board unit, the tool-insertion recessed portion may be provided in an extension lower portion of an engagement portion constituted by the engagement protruding portion and the engagement recessed portion.

Because the tool-insertion recessed portion is provided in the extension lower portion of the engagement portion constituted by the engagement protruding portion and the engagement recessed portion, the distance between the tool-insertion recessed portion and the engagement portion is short. For this reason, the part of the side wall of the cover in which the engagement portion is formed can be easily elastically deformed in the direction away from the side surface of the peripheral wall portion of the case, by inserting a tool into the tool-insertion recessed portion. Accordingly, with the above embodiment, the engagement state between the engagement protruding portion and the engagement recessed portion can be easily released with a tool, the engagement between the case and the cover can be released more easily, and the cover can be easily detached.

In one embodiment of the above board unit, the tool-insertion recessed portion may be provided in the stepped surface of the case.

In the case where the tool-insertion recessed portion is provided in the stepped surface that is formed in the peripheral wall portion of the case, the tool-insertion recessed portion is located on the lower side of the boundary between the stepped surface of the peripheral wall portion of the case and the lower end surface of the side wall of the cover. For this reason, if water is applied from the outside of the board unit, it is suppressed that water droplets adhering to the cover and moving along the side wall enter into the cover from the tool-insertion recessed portion. In the case where water enters the cover, the water is easily discharged from the tool-insertion recessed portion to the outside of the cover. Accordingly, with the above embodiment, it is suppressed that water droplets adhering to the side wall of the cover enter into the case through the stepped surface of the peripheral wall portion of the case from the tool-insertion recessed portion, and thus the circuit board in the case can be protected.

In one embodiment of the above board unit, the tool-insertion recessed portion may have a tapered surface in a tool-insertion direction.

For example, the board unit is assumed to be arranged in the interior of a vehicle. Depending on the arrangement location of the board unit, when a tool is inserted into the tool-insertion recessed portion, there is are cases that the tool cannot be inserted into the tool-insertion recessed portion from the front due to interference between peripheral members and the tool. In this case, the tool may be inserted from an oblique direction. Because the tapered surface is formed in the tool-insertion direction in the tool-insertion recessed portion, the tool can be guided along the tapered surface, and thus the tool can be easily inserted into the tool-insertion recessed portion. Accordingly, with the above embodiment, the detaching work of the cover can be easily performed.

In one embodiment of the above board unit, the engagement protruding portion may be provided in the side surface of the peripheral wall portion of the case, the engagement recessed portion may be provided in the side wall of the cover, and the engagement recessed portion may be a through hole.

Because the engagement recessed portion is provided in the cover and this engagement recessed portion is a through hole, when the cover is assembled to the case, the fact that the engagement protruding portion provided in the case has engaged with the engagement recessed portion (through hole) of the cover can be visually confirmed through the through hole. Accordingly, the engagement state between the engagement protruding portion and the engagement recessed portion (through hole) can be visually confirmed from the outside of the cover, and thus the assembling work of the cover to the case can be reliably performed.

Hereinafter, specific examples of a board unit according to the embodiment of the present disclosure are described with reference to the drawings. In the drawings, identical reference numerals denote components having identical names.

Embodiment 1

Board Unit

A board unit 1 according to Embodiment 1 is described with reference to FIGS. 1 to 5.

Figure 2:
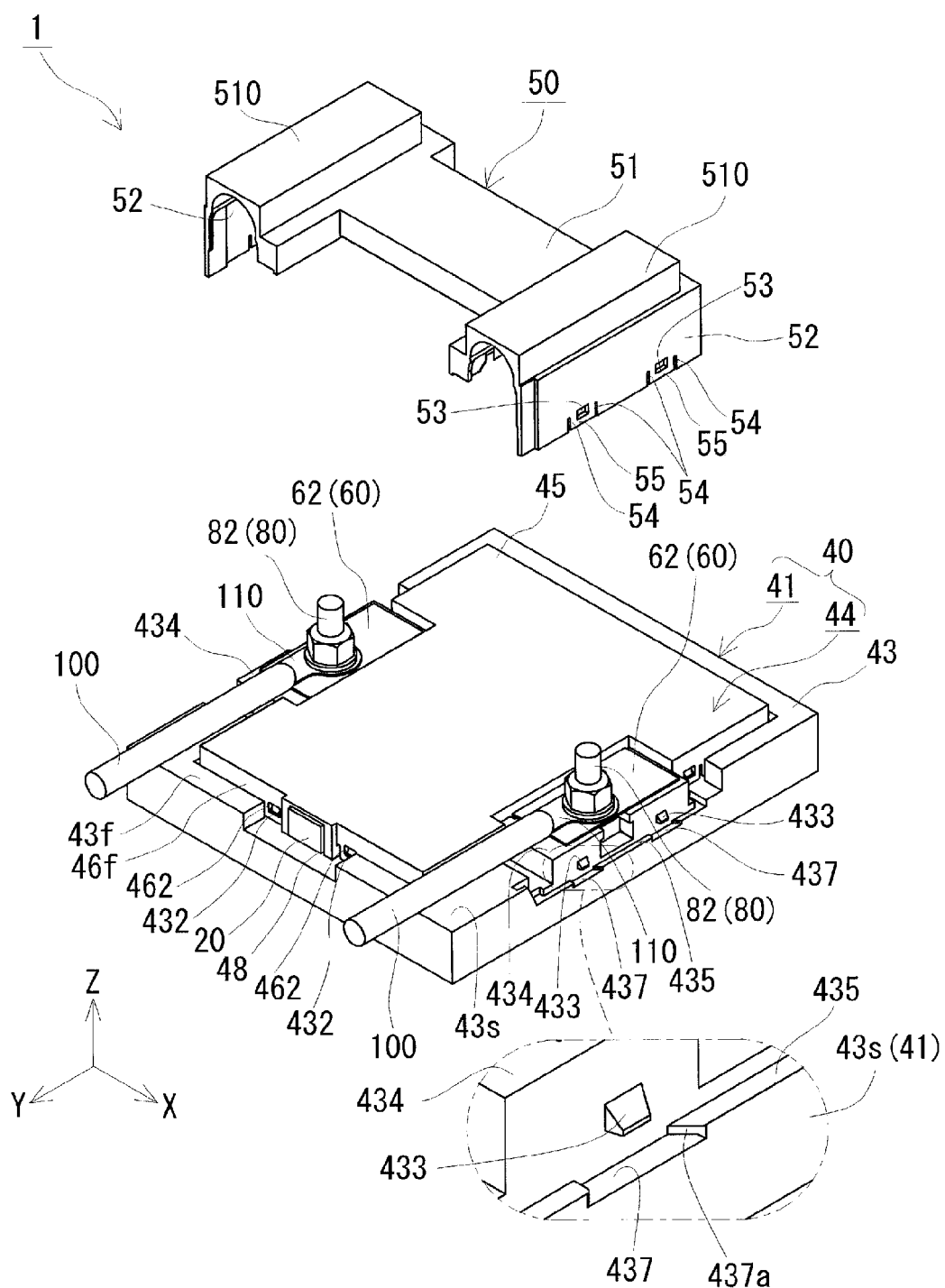
FIG. 2 is a schematic exploded perspective view of the board unit according to Embodiment 1.
Figure 3:
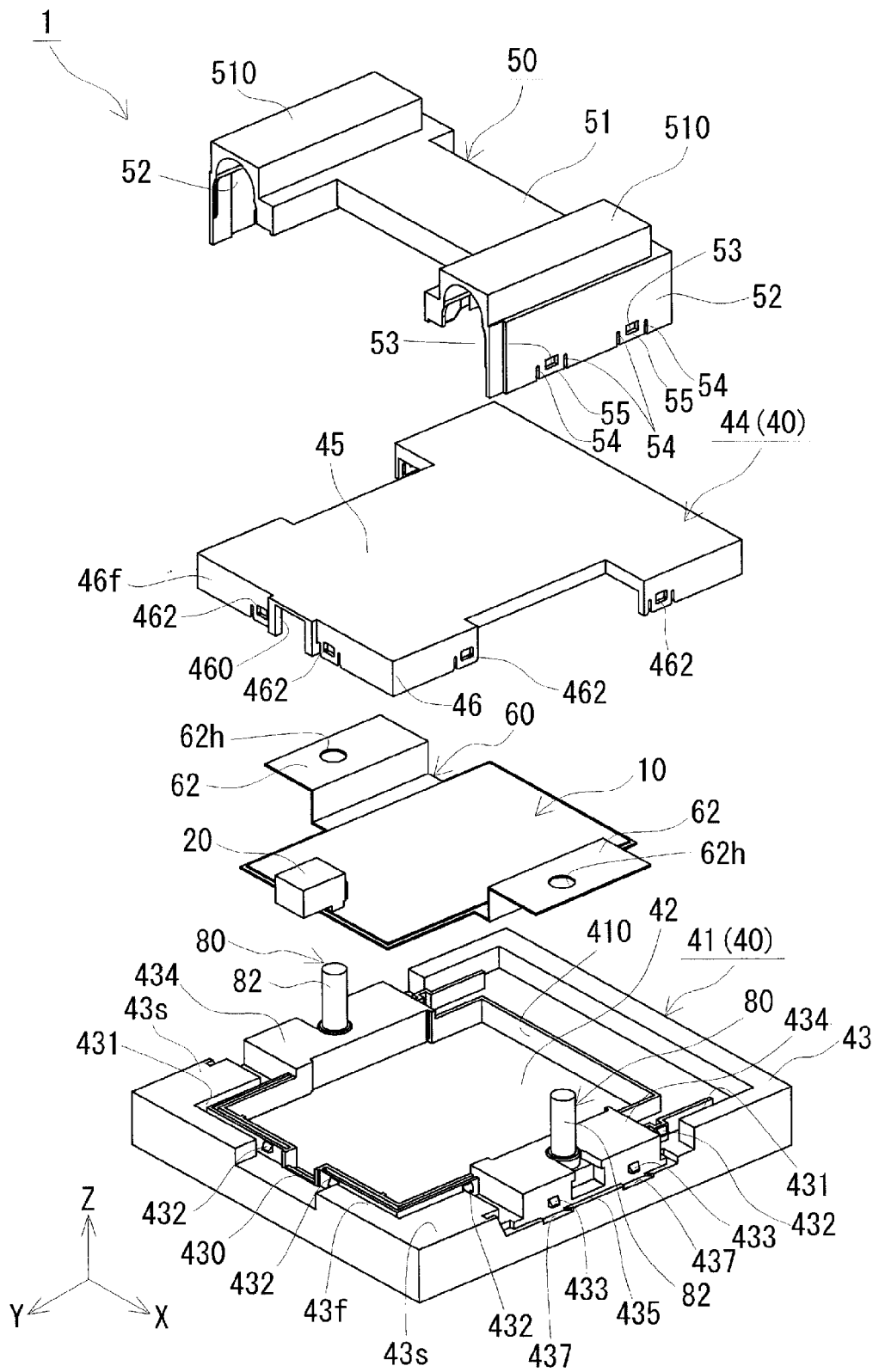
FIG. 3 is another schematic exploded perspective view of the board unit according to Embodiment 1.

As mainly shown in FIGS. 1 to 3, the board unit 1 includes a circuit board 10 (see FIG. 3), a case 40 for accommodating the circuit board 10, a bus bar 60 (see FIG. 3) electrically connected to the circuit board 10, power supply terminals 80 (see FIG. 2) for connecting lead-out portions 62 of the bus bar 60 and connection terminals 110 of electrical wires 100, and a cover 50 covering the power supply terminals 80. The case 40 is constituted by a lower case 41 and an upper case 44 (see FIGS. 2 and 3). One of the features of the board unit 1 is the engagement structure between the case 40 and the cover 50. The feature is in that the board unit includes an engagement mechanism that engages, in a state where the case 40 and the cover 50 are assembled, the case 40 and the cover 50 with each other, and a release mechanism for releasing the engagement of the engagement mechanism. Specifically, as shown in FIGS. 1 and 2, as the engagement mechanism, the engagement protruding portions 433 and the engagement recessed portions 53 that are engaged with each other are respectively provided in the case 40 and the cover 50, and engagement portions 58 are constituted by the engagement protruding portions 433 and the engagement recessed portions 53 being engaged (see a partially-enlarged view surrounded by a long-dashed short-dashed line in FIG. 1). Also, as a release mechanism, tool-insertion recessed portions 437, for inserting a tool (not shown) to release the engagement state between the engagement protruding portions 433 and the engagement recessed portions 53, are provided in the boundaries between stepped surfaces 435 of a peripheral wall portion 43 (side wall portions 43s) of the case 40 and lower end surfaces of side walls 52 of the cover 50.

Hereinafter, the structure of the board unit 1 is described in detail. In the following description, in the board unit 1, the cover 50 side is the upper side, and the case 40 side is the lower side. In the direction orthogonal to the vertical direction, the side on which the connector portion 20 is arranged is the front, and the opposite side thereof is the rear. The direction orthogonal to both the vertical direction and the front-rear direction is left-right direction. In the drawings, the direction shown by an arrow Z is up, the direction shown by an arrow Y is forward, and the direction shown by an arrow X is right.

Circuit Board

As shown in FIG. 3, the circuit board 10 is arranged on the bus bar 60. Electronic components (not shown) such as an FET (Field Effect Transistor) and a switching element, and a connector portion 20 are mounted on the circuit board 10.

Bus Bar

The bus bar 60 is a plate-like member constituting a conductive path for electric power. The bus bar 60 is fixed on the lower surface side of the circuit board 10, and is electrically connected to the circuit board 10.

The bus bar 60 has a substantially rectangular central portion on which the circuit board 10 is arranged and lead-out portions 62 that are bent and extend to the left and the right from the central portion. As shown in FIG. 2, each lead-out portion 62 is a portion that is lead out to the outside of the case 40, and a connection terminal 110 of an electrical wire 100 (wire harness) is electrically connected thereto. In each lead-out portion 62, a later-mentioned insertion hole 62h is formed, through which a shaft portion 82 of the power supply terminal 80 is passed.

Case

As shown in FIGS. 2 and 3, the case 40 accommodates the circuit board 10 integrated with the bus bar 60. The case 40 has the lower case 41 and the upper case 44, and is constituted by the lower case 41 and the upper case 44 being assembled with each other. In the case 40, an opening portion 48 is formed at the location corresponding to the connector portion 20.

Lower Case

As shown in FIG. 3, the lower case 41 has a bottom panel portion 42 supporting the circuit board 10 and the peripheral wall portion 43 accommodating the circuit board 10, and forms an accommodation space 410.

Peripheral Wall Portion

The peripheral wall portion 43 is a substantially rectangular frame-like member, and surrounds four sides of the outer periphery of the circuit board 10. A front wall portion 43f on the front side of the peripheral wall portion 43 includes a lower recessed portion 430 that forms the opening portion 48 (see FIG. 2). Side wall portions 43s on the left and right sides of the peripheral wall portion 43 are provided with terminal blocks 434 on which the power supply terminals 80 are fixed. The lead-out portions 62 of the bus bar 60 rest on the terminal blocks 434.

Power Supply Terminal

Each of the power supply terminals 80 has a shaft portion 82 protruding upwardly from the terminal block 434. The shaft portion 82 passes through the insertion hole 62h formed in the lead-out portion 62 of the bus bar 60. In this example, the power supply terminals 80 are stud bolts, and a male screw is formed on each of the shaft portions 82. As shown in FIG. 2, each shaft portion 82 passes through an insertion hole formed in the connection terminal 110 of the electrical wire 100, and a nut or the like can be screwed to it. In this manner, the lead-out portions 62 of the bus bar 60 are tightly attached and electrically connected to the connection terminals 110 of the electrical wires 100.

Bottom Panel Portion

The bottom panel portion 42 is a substantially rectangular plate-like member arranged on the bottom surface side of the circuit board 10, and holds the central portion of the bus bar 60.

Engagement Projection

In the lower case 41, an insertion groove 431 is formed in the top surface of the peripheral wall portion 43 to receive a peripheral wall 46 of the upper case 44 (to be described). On the inner peripheral wall surfaces of the insertion groove 431, engagement projections 432 are provided for engaging with the upper case 44. The engagement projections 432 protrude from the wall surfaces of the insertion groove 431, and have a downwardly thickening wedge-like shape. Details of the engagement structure between the lower case 41 and the upper case 44 will be given later.

Engagement Protruding Portion

On the side surfaces of the left and right side wall portions 43s, the engagement protruding portions 433 for engaging with the cover 50 protrude toward the side walls 52 of the cover 50 to be described (see FIGS. 1 and 2). Also, the stepped surfaces 435 against which the lower end surfaces of the side walls 52 of the cover 50 abut are formed on the side surfaces of the side wall portions 43s, and the side surfaces of the terminal blocks 434 are located inward in the left and right direction of the lower surfaces of the stepped surfaces 435. Because the stepped surfaces 435 are formed in the side surfaces of the side wall portions 43, the side surfaces of the side wall portions 43s and the outer surfaces of the side walls 52 are substantially flush with each other in the state where the case 40 and the cover 50 are assembled (see FIG. 1). The stepped surfaces 435 are provided with the tool-insertion recessed portions 437 (to be described). Details of the engagement structure between the case 40 (the lower case 41) and the cover 50 will be described later.

Upper Case

As shown in FIG. 3, the upper case 44 is a member for covering the accommodation space 410 of the lower case 41 from above. The upper case 44 has a top panel portion 45 to be arranged on the top surface side of the circuit board 10, and a peripheral wall 46 that extends downwardly from the periphery of the top panel portion 45. The top panel portion 45 and the peripheral wall 46 are formed as a single piece. A front wall 46f on the front side of the peripheral wall 46 includes an upper recessed portion 460 that forms the opening portion 48 (see FIG. 2).

Engagement Hole

The peripheral wall 46 is inserted into the insertion groove 431 formed in the lower case 41, and is engaged with the lower case 41. The peripheral wall 46 is provided with engagement holes 462 to be engaged with the engagement projections 432 provided in the insertion groove 431 of the lower case 41.

Engagement Structure Between Lower Case 41 and Upper Case 44

As shown in FIGS. 2 and 3, by the peripheral wall 46 of the upper case 44 being inserted into the insertion groove 431 of the lower case 41 (the peripheral wall portion 43) from above, the upper case 44 is assembled to the lower case 41, and the engagement projections 432 of the lower case 41 are engaged with the engagement holes 462 of the upper case 44. Engagement between the engagement projections 432 and the engagement holes 462 ensures the engagement between the lower case 41 and the upper case 44 in an assembled state to constitute the case 40 (see FIG. 2). A clearance is provided between the lower case 41 and the upper case 44, and allows the lead-out portions 62 of the bus bar 60 to be extended out of the case 40.

Cover

As shown in FIGS. 1 and 2, the cover 50 is a member assembled to the case 40 (the lower case 41) from above so as to cover the power supply terminals 80. The cover 50 has a top wall 51 that is provided with left and right covering portions 510 for covering the power supply terminals 80, and a pair of left and right side walls 52 extending downwardly from both side edges of the top wall 51. The left and right side walls 52, configured to engage with the lower case 41 of the case 40, are disposed so as to overlap the outer sides of the side surfaces of the left and right side wall portions 43s so as to sandwich the case 40 from the left and right sides.

Engagement Recessed Portion

Figure 4:
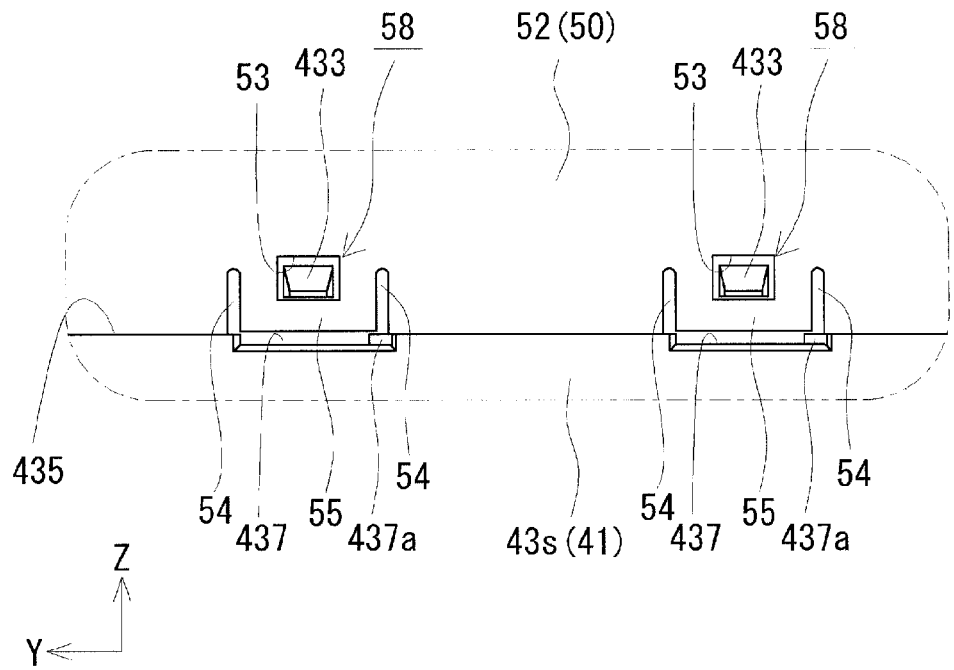
FIG. 4 is an enlarged schematic side view showing a main part of the board unit according to Embodiment 1.

Each of the side walls 52 has engagement recessed portions 53 to be engaged with the engagement protruding portions 433 formed on the side surfaces of the side wall portions 43s (the terminal block 434) of the lower case 41. In this example, the engagement recessed portions 53 are through holes, and two such engagement recessed portions 53 are provided side by side in the central portion in the forward-backward direction (the longitudinal direction). As mentioned above, the maximum protrusion height of the engagement protruding portions 433 is less than the thickness of the side walls 52 of the cover 50. Accordingly, the engagement protruding portions 433 are accommodated in the engagement recessed portions 53, and do not protrude from the outer surfaces of the side walls 52. As shown in FIGS. 3 and 4, slits 54, which extend upwardly from the lower end of each side wall 52, are formed on both sides of each engagement recessed portions 53 in the forward-backward direction. Each pair of slits 54 defines a lock piece portion 55 therebetween, and each lock piece portion 55 includes the engagement recessed portion 53.

Engagement Structure Between Case 40 and Cover 50

As shown in FIGS. 1 and 2, by the side walls 52 of the cover 50 being fitted from above into the side surfaces of the case 40 (the lower case 41), the cover 50 is assembled to the case 40, and the engagement protruding portions 433 of the side surfaces of the side wall portions 43s (the terminal blocks 434) are engaged with the engagement recessed portions 53 of the side walls 52. The engagement portions 58 are constituted by the engagement between the engagement protruding portions 433 and the engagement recessed portions 53, which ensures the engagement of the case 40 and the cover 50 in an assembled state (see FIG. 1). In this example, the engagement recessed portions 53 are provided in the lock piece portions 55 of the side walls 52 (see FIGS. 3 and 4). In the process of assembling the cover 50 to the case 40 from above, this structure allows the lock piece portions 55 to elastically deform and to slide on the engagement protruding portions 433. Then, the lock piece portions 55 elastically recover at the position where the engagement protruding portions 433 are engaged with the engagement recessed portions 53.

Furthermore, in the present embodiment, the tool-insertion recessed portions 437 are provided in the boundaries between the stepped surfaces 435 of the side wall portions 43s of the case 40 (lower case 41) and the lower end surfaces of the side walls 52 of the cover 50. By inserting a tool (not shown) into the tool-insertion recessed portion 437, the engagement state between the engagement protruding portion 433 and the engagement recessed portion 53 can be released. Specifically, the tip of the tool is inserted into the tool-insertion recessed portion 437, the side wall 52 of the cover 50 is raised from the side surface of the side wall portion 43s (terminal block 434), and the side wall 52 of the cover 50 elastically deforms in the direction away from that side surface. As a result, the engagement state between the engagement protruding portion 433 and the engagement recessed portion 53 is released. A tool used for releasing the engagement state between the engagement protruding portions 433 and the engagement recessed portions 53 includes a flat-plate shaped tool that has a sharp tip portion (e.g., a flathead screw driver). Details of the tool-insertion recessed portion 437 will be described later.

Tool-Insertion Recessed Portion

In the state where the case 40 and the cover 50 are assembled (see FIG. 1), the tool-insertion recessed portions 437 are provided in the boundaries between the stepped surfaces 435 of the side wall portions 43s and the lower end surfaces of the side walls 52. The shape and dimensions of the tool-insertion recessed portions 437 are a shape and dimensions corresponding to the tip portion of a tool to be inserted thereinto. In this example, as shown in FIGS. 1 and 2, the tool-insertion recessed portions 437 are provided in the stepped surfaces 435, and the shape of the opening formed by the tool-insertion recessed portion 437 and the lower end surface of the side wall 52 is substantially rectangular (see FIG. 4). As shown in FIG. 4, the tool-insertion recessed portions 437 are provided in the portions extending downward from the engagement portions 58 (extension lower portions) constituted by the engagement protruding portions 433 and the engagement recessed portions 53. Specifically, in each of the stepped surfaces 435, the tool-insertion recessed portion 437 is provided in the portion opposite the lower end surface of the lock piece portion 55 of the side wall 52. The lower end surface of the side wall 52 excluding the lock piece portions 55, that is, the lower end surfaces positioned on both sides in the front-rear direction of a lock piece portion 55 abut against the stepped surface 435.

Figure 5:
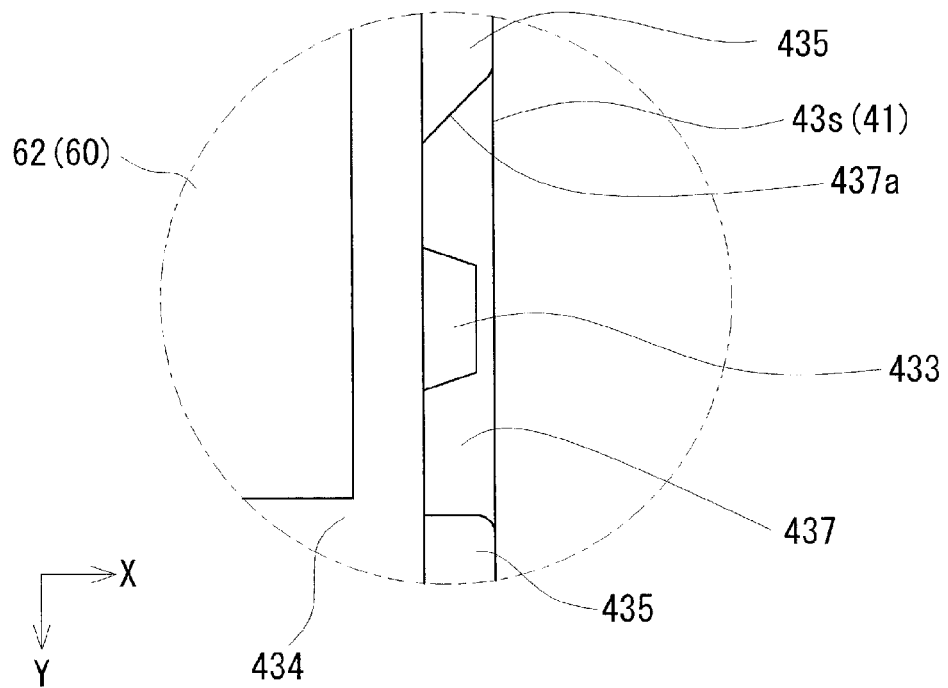
FIG. 5 is an enlarged schematic top view of a tool-insertion recessed portion in Embodiment 1.

Also, in this example, the tool-insertion recessed portions 437 have a tapered surface 437a in the tool-insertion direction (see the partially-enlarged view surrounded by a long-dashed and short-dashed line in FIG. 2). Specifically, as shown in FIG. 5, in the tool-insertion recessed portion 437, the tapered surface 437a whose opening width becomes more narrow from the outer side toward the inner side is formed on the inner side surface on the rear side of a pair of inner side surfaces (the right side of FIG. 4 and the upper side of FIG. 5) that oppose each other in the front-rear direction (longitudinal direction). Accordingly, when viewing the tool-insertion recessed portion 437 in a plan view, the plane shape of the tool-insertion recessed portion 437 is a substantially right-angle trapezoidal shape (see FIG. 5).

Operation and Effects

The board unit 1 according to Embodiment 1 presents the following operation and effects.

Engagement between the engagement protruding portions 433 provided on the side wall portions 43s of the case 40 (the lower case 41) and the engagement recessed portions 53 provided in the side walls 52 of the cover 50 ensures the engagement between the case 40 and the cover 50 in an assembled state. Furthermore, because the tool-insertion recessed portions 437 are provided in the boundaries between the stepped surfaces 435 of the side wall portions 43s of the case 40 and the lower end surfaces of the side walls 52 of the cover 50, the engagement state between the engagement protruding portions 433 and the engagement recessed portions 53 can be released by using a tool. Specifically, the tip of a tool is inserted into the tool-insertion recessed portion 437, and then the side wall 52 of the cover 50 elastically deforms in the direction away from the side surface of the side wall portion 43s of the case 40. As a result, the engagement state between the engagement protruding portion 433 and the engagement recessed portion 53 is released. Accordingly, the engagement between the case 40 and the cover 50 can be easily released by using a tool, and thus the cover 50 can be easily detached from the case 40.

Also, the stepped surfaces 435 against which the lower end surfaces of the side walls 52 of the cover 50 abut are formed in the side surfaces of the side wall portions 43s of the case 40, and the side surfaces of the side wall portions 43s and the outer surfaces of the side walls 52 are substantially flush with one another in the state where the case 40 and the cover 50 are assembled. Accordingly, the side walls 52 do not protrude past the side surfaces of the side wall portions 43s, and thus the size of the board unit 1 can be reduced while maximally securing the accommodation space 410 in the case 40. Therefore, the board unit 1 can be arranged in the limited space of a vehicle, and the arrangement space can be used to its fullest.

In the extension lower portions of the engagement portions 58, specifically, in the stepped surfaces 435 formed in the side surfaces of the side wall portions 43s, the tool-insertion recessed portions 437 are provided in the portions opposite the lower end surfaces of the lock piece portions 55 of the side walls 52. Because the tool-insertion recessed portion 437 is provided in the extension lower portion of the engagement portion 58, the distance between the tool-insertion recessed portion 437 and the engagement portion 58 is short. Accordingly, the lock piece portion 55 constituting the engagement portion 58 can be easily elastically deformed by inserting a tool into the tool-insertion recessed portion 437, and thus the engagement state between the engagement protruding portion 433 and the engagement recessed portion 53 can be easily released by using the tool. Therefore, the engagement between the case 40 and the cover 50 can be easily released, and thus the cover 50 can be easily detached.

Because the tool-insertion recessed portions 437 are provided in the stepped surfaces 435, the tool-insertion recessed portions 437 are located on the lower side of the boundaries between the stepped surfaces 435 of the side wall portions 43s and the lower end surfaces of the side wall portions 52. For this reason, when the outside of the board unit cover 1 is exposed to water, water droplets are kept from adhering to the cover 50, moving along the side walls 52, and entering the cover 50 from the tool-insertion recessed portions 437. Accordingly, water droplets are kept from adhering to the side walls 52 of the cover 50, and entering the case 40 through the stepped surfaces 435 from the tool-insertion recessed portions 437, and thus the circuit board 10 in the case 40 can be protected.

Because each tool-insertion recessed portion 437 corresponds to an engagement portion 58 and is provided in each of the portions opposite the lower end surfaces of the lock piece portions of the side walls 52, the engagement of the engagement portions 58 can be easily released. Also, because the lower end surface of the side wall 52 excluding the lock piece portion 55, that is, the lower end surfaces positioned on both sides in the front-rear direction of a lock piece portion 55 abut against the stepped surface 435 (see FIG. 4), looseness of the cover 50 with respect to the case 40 can be prevented.

Because the tapered surface 437a is formed in the tool-insertion recessed portions 437, the tip of a tool can be guided along the tapered surface 437a. Accordingly, it is easy to insert the tool into the tool-insertion recessed portion 437 from obliquely rearward thereof. Therefore, if a tool is inserted into the tool-insertion recessed portion 437 from obliquely rearward thereof, the detaching work of the cover 50 can be easily performed.

Because the engagement recessed portions 53 provided in the cover 50 are through holes, when the cover 50 is assembled to the case 40, the fact that the engagement protruding portions 433 provided in the case 40 have engaged with the engagement recessed portions (through holes) 53 can be visually confirmed through the through holes. Accordingly, the engagement state between the engagement protruding portions 433 and the engagement recessed portions 533 can be easily visually confirmed from the outside of the cover 50, and thus the assembling work of the cover 50 to the case 40 can be reliably performed. Also, because the slits 54 are formed in the side wall 52 and the engagement recessed portion 53 is provided in the lock piece portion 55, the engagement protruding portion 433 can be easily engaged with the engagement recessed portion 53 by the lock piece portion 55 being elastically deformed.

Modification 1

In above-mentioned Embodiment 1, the case where the tool-insertion recessed portions 437 are provided on the case 40 (the lower case 41) side, that is, in the stepped surfaces 435 of the side wall portions 43s has been described (see FIG. 4). The tool-insertion recessed portions may also be provided on the cover 50 side, that is, in the lower end surfaces of the side walls 52 and not in the stepped surfaces 435. In this case, the lower end edge of each lock piece portion 55 of the side walls 52 may be cut out to form the tool-insertion recessed portion.

In above-mentioned Embodiment 1, the case where, in the inner side surface of the tool-insertion recessed portion 437, the inner side surface on the rear side is the tapered surface 437a, and the insertion direction of a tool is obliquely rearward has been described (see FIG. 5). In the case where the insertion direction of a tool is obliquely forward, in the tool-insertion recessed portion 437, the tapered surface whose width becomes more narrow from the outer side to the inner side may be formed on the inner side surface on the front side of the tool-insertion recessed portion 437 (the left side of FIG. 4 and the lower side of FIG. 5).

Modification 3

In above-mentioned Embodiment 1, the case where the engagement protruding portions 433 are provided in the side wall portions 43s of the case 40 (the lower case 41) and the engagement recessed portions 53 are provided in the side walls 52 of the cover 50 has been described. Alternatively, the engagement protruding portions may also be provided in the side walls 52 of the cover 50 and the engagement recessed portions may also be provided in the side wall portions 43s of the case 40. Specifically, in the side walls 52 of the cover 50, the engagement protruding portions, which protrude from the inner surface toward the side surfaces of the side wall portions 43s of the case 40, may be provided, and the engagement recessed portions, with which the engagement protruding portions are engaged, may be provided in the side surfaces of the side wall portions of the case 40. Also in this case, the case 40 and the cover 50 can be engaged by the engagement between the engagement protruding portions and the engagement recessed portions.

Uses of Embodiment of Present Disclosure

The board unit according to the embodiment of the present disclosure is suitably applicable to high-current power control units including a DC/DC converter, an AC/DC converter, a DC/AC inverter to be installed in vehicles such as automobiles.

The present disclosure is not limited to the above-described examples, and is intended to encompass all variations indicated by, equivalent to, and falling within the equivalency range of, the appended claims.

The invention claimed is:

1. A board unit 1 comprising:
   a circuit board;
   a case having a peripheral wall portion for accommodating the circuit board;
   a bus bar electrically connected to the circuit board and having a lead-out portion that is led out to the outside of the case;
   a power supply terminal for connecting the lead-out portion of the bus bar and a connection terminal of an electrical wire; and
   a cover that is assembled from above with respect to the case so as to cover the power supply terminal, and has a side wall overlapping the outer side of a side surface of the peripheral wall portion,
   wherein a stepped surface against which a lower end surface of the side wall of the cover abuts is formed in the side surface of the peripheral wall portion of the case, the step surface being a raised portion of the side surface of the peripheral wall portion so as to form a pair of slits disposed on both sides of the stepped surface,
   an engagement protruding portion is provided in one of the side surface of the peripheral wall portion of the case, and an engagement recessed portion with which the engagement protruding portion is engaged is provided on the cover, and
   a tool-insertion recessed portion, into which a tool for releasing an engagement state of the engagement protruding portion and the engagement recessed portion is inserted, is defined by the slits on the sides of the stepped surface of the peripheral wall portion of the case and the lower end surface of the side wall of the cover.

2. The board unit according to claim 1, wherein the engagement recessed portion is provided in the side wall of the cover, and the engagement recessed portion is a through hole.

3. The board unit according to claim 1, wherein
   the tool-insertion recessed portion is provided in an extension lower portion of an engagement portion constituted by the engagement protruding portion and the engagement recessed portion.

4. The board unit according to claim 3, wherein the tool-insertion recessed portion is provided in the stepped surface of the case.

5. The board unit according to claim 3, wherein the tool-insertion recessed portion has a tapered surface in a tool-insertion direction.

6. The board unit according to claim 3, wherein the engagement recessed portion is provided in the side wall of the cover, and the engagement recessed portion is a through hole.

7. The board unit according to claim 1, wherein the tool-insertion recessed portion is provided in the stepped surface of the case.

8. The board unit according to claim 7, wherein the tool-insertion recessed portion has a tapered surface in a tool-insertion direction.

9. The board unit according to claim 7, wherein the engagement recessed portion is provided in the side wall of the cover, and the engagement recessed portion is a through hole.

10. The board unit according to claim 1, wherein the tool-insertion recessed portion has a tapered surface in a tool-insertion direction.

11. The board unit according to claim 10, wherein the engagement recessed portion is provided in the side wall of the cover, and the engagement recessed portion is a through hole.

* * * * *